US009704816B1

(12) United States Patent
Huang

(10) Patent No.: US 9,704,816 B1
(45) Date of Patent: Jul. 11, 2017

(54) ACTIVE REGION STRUCTURE AND FORMING METHOD THEREOF

(71) Applicants: United Microelectronics Corp., Hsinchu (TW); Fujian Jinhua Integrated Circuit Co., Ltd., Fujian Province (CN)

(72) Inventor: Tsai-Yu Huang, Hsinchu County (TW)

(73) Assignees: United Microelectronics Corp., Hsinchu (TW); Fujian Jinhua Integrated Circuit Co., Ltd., Fujian Province (CN)

( * ) Notice: Subject to any disclaimer, the term of this patent is extended or adjusted under 35 U.S.C. 154(b) by 0 days.

(21) Appl. No.: 15/296,942

(22) Filed: Oct. 18, 2016

(30) Foreign Application Priority Data

Sep. 12, 2016 (CN) .......................... 2016 1 0817060

(51) Int. Cl.
H01L 21/762 (2006.01)
H01L 23/00 (2006.01)
H01L 29/06 (2006.01)
H01L 21/461 (2006.01)

(52) U.S. Cl.
CPC .......... *H01L 23/562* (2013.01); *H01L 21/461* (2013.01); *H01L 21/76224* (2013.01); *H01L 21/76229* (2013.01); *H01L 29/0649* (2013.01)

(58) Field of Classification Search
CPC ... H01L 21/042; H01L 21/0425; H01L 21/46; H01L 21/461; H01L 21/64; H01L 21/70; H01L 21/702; H01L 21/71; H01L 21/7602
See application file for complete search history.

(56) References Cited

U.S. PATENT DOCUMENTS

| 5,202,275 | A  | 4/1993  | Sugiura et al. |
| 6,696,349 | B2 | 2/2004  | Vollrath et al. |
| 7,034,408 | B1 | 4/2006  | Schloesser |
| 7,276,410 | B2 | 10/2007 | Bae |
| 7,563,699 | B2 | 7/2009  | Yeom |
| 7,741,174 | B2 | 6/2010  | Cho |
| 7,772,631 | B2 | 8/2010  | Schloesser |
| 8,048,737 | B2 | 11/2011 | Kim et al. |
| 8,395,198 | B2 | 3/2013  | Uchiyama |
| 8,691,680 | B2 | 4/2014  | Wang |
| 2011/0198758 | A1 | 8/2011 | Jeon et al. |

(Continued)

OTHER PUBLICATIONS

John Poulton, "An Embedded DRAM for CMOS ASICs," Proceedings of the 17th Conference on Advanced Research in VLSI (ARVLSI '97), Sep. 15-16, 1997, pp. 288-302.

*Primary Examiner* — Cheung Lee
(74) *Attorney, Agent, or Firm* — J.C. Patents

(57) ABSTRACT

An active region structure includes a device region, an active layer and a shallow trench isolation (STI) layer. The device region is defined on a substrate. The active layer is formed by a top portion of the substrate and has a plurality of device cells within the device region and a border structure surrounding the device region. The border structure has at least one branch extending into the device region and is between a portion of the device cells. The STI layer has a first part formed within the border structure to insulate the device cells from one another and a second part surrounding an outer periphery of the border structure. The second part of the STI layer isolates the device cells from a peripheral active region.

16 Claims, 8 Drawing Sheets

(56) References Cited

U.S. PATENT DOCUMENTS

2012/0171867 A1\* 7/2012 Kim .................... H01L 21/3086
                                                    438/702
2013/0193488 A1    8/2013 Or-Bach et al.

\* cited by examiner

ACTIVE REGION STRUCTURE AND FORMING METHOD THEREOF

CROSS-REFERENCE TO RELATED APPLICATION

This application claims the priority benefit of China application serial no. 201610817060.1, filed on Sep. 12, 2016. The entirety of the above-mentioned patent application is hereby incorporated by reference herein and made a part of this specification.

BACKGROUND

Field of the Invention

The invention is directed to a semiconductor technology. More particularly, the invention is directed to an active region structure and a forming method thereof.

Description of Related Art

In recent years, electronic products are generally designed with multifunction and fast processing capability. In order to increase the processing capability, a computer system or a multifunctional electronic product, for example, requires a dynamic random access memory (DRAM) with large capacity. For increasing the memory capacity, a size of memory cells of a memory has to be reduced; however, other problems arise therefrom after the size of the memory cells are significantly reduced, which lead to instability or damage to the operation of the memory cells.

In a semiconductor device, an active layer unit is generally defined on a substrate and employed as a base that a required device structure is formed thereon. Thus, as the active layer unit on the substrate is employed as a base of the device, a size, a shape and a position of the device are determined based thereon. The active layer unit is also referred to as a device cell hereinafter.

Taking memory cells of a memory as an example, a plurality of memory cells are regularly arranged in a predetermined device region to form an array. A device cell eventually forms a memory cell. Moreover, for the memory cells capable of being operated, some peripheral circuits are provided in the periphery of the memory cells to control the memory cells. The peripheral circuits are also formed based on a peripheral active region.

Therefore, under the need of dramatically reducing the dimension of the semiconductor device, how to design the device structure for maintaining them in normal operation is one of the subjects to be considered.

SUMMARY

The invention provides an active region structure and a forming method thereof, at least capable of preventing the semiconductor device from being damaged resulted from stress generated by a shallow trench isolation (STI) structure in a periphery of a semiconductor device when a dimension of the semiconductor device is reduced.

According of an embodiment of the invention, an active region structure is provided. The active region structure includes a device region, an active layer and a shallow trench isolation (STI) layer. The device region is defined on a substrate. The active layer is formed by a top portion of the substrate and has a plurality of device cells within the device region and a border structure surrounding the device region. The border structure has at least one branch extending into the device region and is between a portion of the device cells. The STI layer has a first part formed within the border structure to insulate the device cells from one another and a second part surrounding an outer periphery of the border structure. The second part of the STI layer isolates the device cells from a peripheral active region.

According of an embodiment of the invention, a method of forming an active region structure is provided. The method includes the following steps. A device region is set on a substrate. A top portion of the substrate is patterned to form an active layer. The active layer has a plurality of device cells within the device region and a border structure surrounding the device region. The border structure has at least one branch extending into the device region and is between a portion of the device cells. An STI layer is formed on the substrate. The STI layer has a first part formed within the border structure to insulate the device cells from one another and a second part surrounding an outer periphery of the border structure. The second part of the STI layer isolates the device cells from a peripheral active region.

In an embodiment, each of the device cells is a strip device in a longitudinal direction. The device cells are aligned in the longitudinal direction to foini a plurality of active lines, and each of the active lines has multiple of the device cells.

In an embodiment, each of the at least one branch is aligned to a corresponding active line among the active lines, and between two adjacent active lines.

In an embodiment, the multiple device cells and the branch belonging to the same active line have a same line width.

In an embodiment, the outer periphery of the border structure has a plurality of notches.

In an embodiment, the border structure includes a plurality of separated multi-segment borders respectively disposed at multiple edges of the device region, and the STI layer isolates the multi-segment borders from one another.

In an embodiment, the outer periphery of the multi-segment borders has at least one notch.

In an embodiment, the border structure continuously surrounds the device region.

To sum up, in the active region structure and the fabrication method thereof provided by the invention, the periphery of the device region also includes the border structure surrounding the device region, such that the stress generated in the device region by the STI layer with a greater area in the outer periphery can be blocked. Thereby, the device cells in the periphery region of the device region can be prevented from being damaged due to the stress. In addition, the border structure includes the at least one branch extending into the device region, which can compensate the unbalanced stress occurring between the end parts of the active lines and also can prevent the device cells from being damaged.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Semiconductor devices, e.g., memory cells, have to be isolated to achieve an insulation effect. As an insulation structure requires high device density, a method that a shallow trench isolation (STI) layer, for example, is formed between device cells and between the device cells and a peripheral active region is required, so as to provide an insulation effect between the devices.

As insulation quality between the devices is considered in the invention, a corresponding design is provided.

A material of the STI layer includes a dielectric material, and the device cells and the peripheral active region are formed by a portion of a substrate, such as a surface portion of a silicon substrate, which are formed after being patterned. Furthermore, a distance between each of the device cells and the peripheral active region is greater than a gap between each of the device cells and occupies a greater area, thereby generating greater stress. As a result, the material of the STI layer causes unbalanced stress to a peripheral region of the device cells and easily damages some of the device cells in the periphery. The invention provides an efficient design for forming the device cells, which can contribute to mitigating the stress effect caused by the STI layer to the device cells and preventing the device cells from being damaged.

Several embodiments are provided below for describing the invention; however, the invention is not limited by the embodiments provided below.

Figure 1:
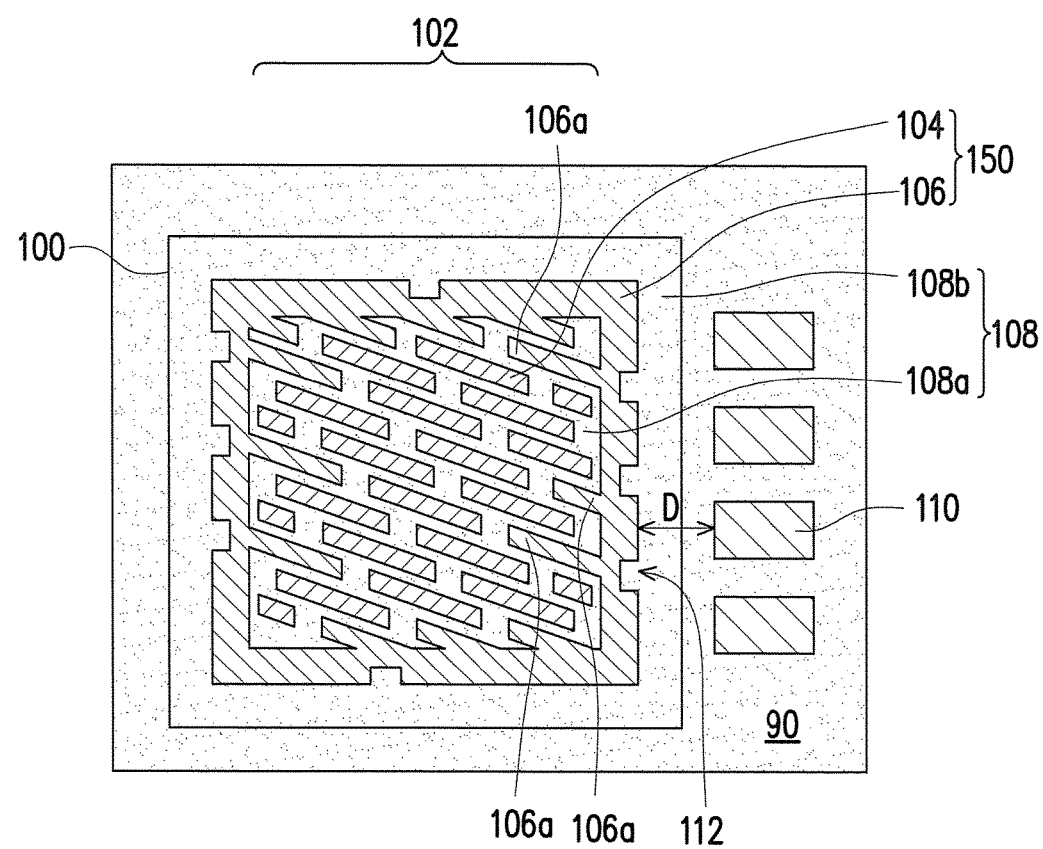
FIG. 1 is a schematic top view of an active region structure according to an embodiment of the invention.

FIG. 1 is a schematic top view of an active region structure according to an embodiment of the invention. Referring to FIG. 1, an overall semiconductor structure of an apparatus, by taking a memory apparatus 90 as an example, includes an active region 700, a peripheral active region 110 and an insulation layer 108 therebetween for insulating them from each other. The active region 100 is a region for forming high-density devices. Taking the memory apparatus 90 for example, the active region 100 is a region for forming a memory cell array. The active region 100 includes a device region 102. A plurality of device cells 104 are predicted to be formed within the device region 102 to serve as a basis for a device structure to be fabricated. Namely, the region of the array formed by the device cells 104 is also referred to as the device region 102 hereinafter.

The active region 100 also includes a border structure 106 in an outer periphery of the device region 102. In one of the provided embodiments, the border structure 106 continuously surrounds the device region 102, for example.

The device cells and the border structure 106 are formed in a process of patterning the surface of the substrate. The substrate is, for example, a silicon substrate. The device cell 104 and the border structure 106 hereinafter are collectively referred to as an active layer 150 having the plurality of device cells 104 within the device region 102 and the border structure 106 surrounding the device region 102.

The border structure 106 of the invention has at least one branch 106a extending into the device region 102 and is between a portion of the device cells 104. The number of the at least one branch 106a is generally plural.

The active region 100 also includes the STI layer 108 used to insulate the device cells 104 from one another and relatively isolate the device cells 104 from peripheral active region 110. It can be understood herein that the STI layer 108 included in the active region 100 is a portion of the overall structure. The STI layer 108 actually extends to the peripheral active region 100 and also provides the insulation effect for the peripheral active region 110.

In a preferred structure of an embodiment, the STI layer 108 has a first part 108a and a second part 108b. The first part 108a is formed within the border structure 106 to insulate the device cells 104 from one another. The second part 108b surrounds the border structure 106. Namely, the second part 108b of the STI layer 108 isolates the device cells 104 from the peripheral active region 110.

The peripheral active region 100 is used for forming a peripheral circuit device and is also formed by patterning the surface of the substrate. Taking the memory apparatus 90 for example, the peripheral active region 100 is used for forming a peripheral circuit to control operations of the memory cells, such as data storage, reading and deleting. Additionally, a position for a subsequently formed memory cell structure corresponds to the device cells 104 and is based on the device structure of the device cell 104.

It should be mentioned that a distance D is between the border structure 106 and the peripheral active region 110. The distance D in a general scenario is greater than a gap between each of the device cells 104. Thus, the second part 108b of the STI layer 108 has greater stress with respect to the first part 108a between the border structure 106 and the peripheral active region 110. However, the border structure 106 of the invention can block the stress generated by the second part 108b of the STI layer 108.

A further effect is that the branches 106a extend into the device region 102 of the device cells 104, such that stress in the periphery of the device region 102 is uniform. Furthermore, each of the device cells 104 has a strip shape, i.e., a strip structure and has a longitudinal direction. Thus, the device cells are aligned to one another in the longitudinal direction to form a plurality of active lines. A direction of the active lines is, for example, inclined relatively to a side of the device region 102. Each of the active lines includes multiple of the device cells 104. However, positions of the device cells on two adjacent active lines are not in consistency, but arranged in alternation. Thus, end parts of the active lines are not all neatly fall within the periphery of the device region 102 according to the positions of the device cells 104, and the end parts of some of the active lines are recessed into the device region 102. In terms of the phenomenon of the active lines, the recessed-in active lines would cause unbalanced stress to the end parts of two adjacent active lines. However, each of the branches 106a of the border structure 106 is aligned to one of the active lines and located between two adjacent active lines. Thus, resulted from the effect of the branches 106a, the periphery of the device region 102 has a more uniform stress distribution to achieve stress balance, thereby, mitigating the damage caused by the device cells 104 in the periphery of the device region 102.

In this case, a line width of each branch 106a is, for example, consistent with that of each active line, so as to obtain better stress balance. Additionally, notches 112 may also be formed in the outer periphery of the border structure 106, for example. An amount, a depth and a width of the notches 112 may be determined based on actual demands. In the presence of a mechanical effect of the notches 112, strength of the border structure 106 can be increased, so as to block the stress generated by the STI layer 108 in the outer periphery.

According to the mechanism of the border structure 106 of the invention, the border structure 106 is not limited to continuously surrounding the device region 102 as set forth in the above embodiment. The border structure 106 may also partially surrounds the device region 102 in correspondence to the peripheral active region 110. Thus, the border structure 106 may partially surround the device region 102. However, based on actual circuit scheme, the peripheral active regions 110 are provided in the periphery of the device region 102 for various kinds of circuits. Thus, in the present embodiment, the border structure 106 may be plural, and the plurality of border structures 106 are not directly connected. Taking the device region 102 in a quadrilateral shape for example, it may be discontinuously surrounded by four border structures 106.

Figure 2:
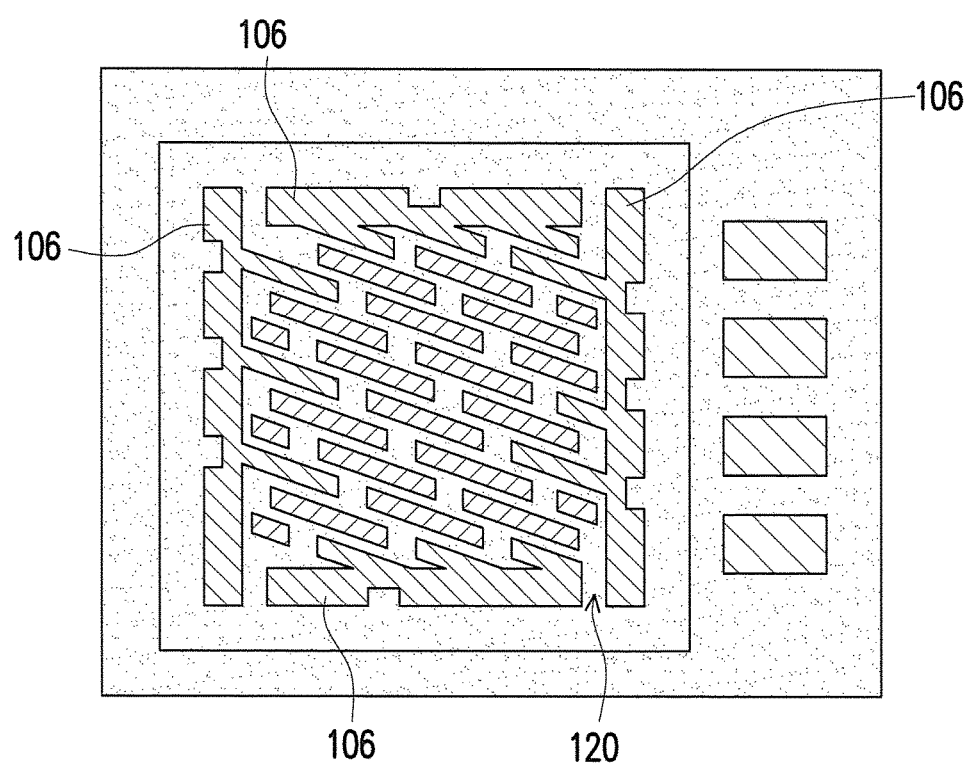
FIG. 2 is a schematic top view of an active region structure according to an embodiment of the invention.

FIG. 2 is a schematic top view of an active region structure according to an embodiment of the invention. Referring to FIG. 2, FIG. 2 illustrates a structure similar to that in FIG. 1, where the device region 102 is surrounded by a plurality of border structures 106. Taking the quadrilateral device region 102 for example, it is discontinuously surrounded by four border structures 106. Namely, the border structures 106 have a gap 120 therebetween and separating one another, thereby, forming separated border structures 106, which also have the structures of branches 106a based on the actual situation. However, the number of the border structures 106 is set based on actual demands and is not limited to four.

In an embodiment provided below, one of the methods of how to fabricate the structure illustrated in FIG. 1 by the semiconductor fabrication process is exemplarily described. FIGS. 3A through 3F are schematic cross-sectional views illustrating a process of fabricating an active region structure according to an embodiment of the invention. FIGS. 4A through 4C are schematic cross-sectional views illustrating a process of fabricating an active region structure according to an embodiment of the invention.

Figure 3A:
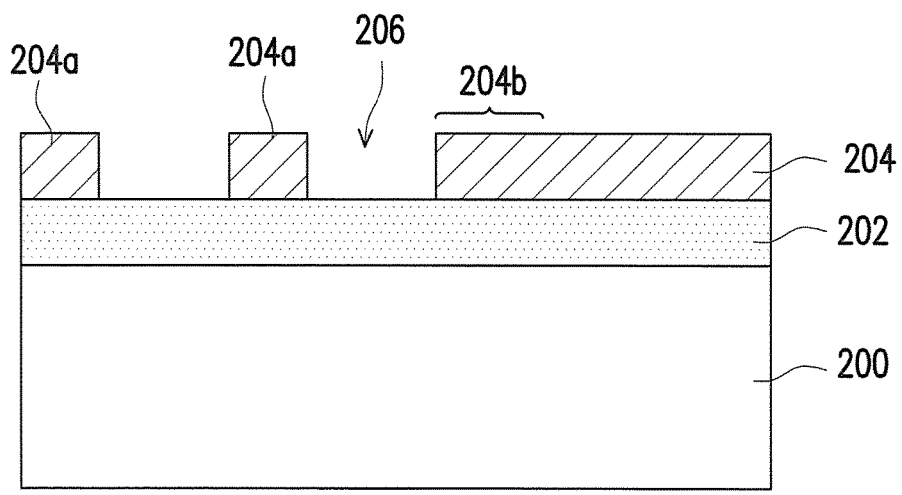
FIGS. 3A through 3F are schematic cross-sectional views illustrating a process of fabricating an active region structure according to an embodiment of the invention.
Figure 4A:
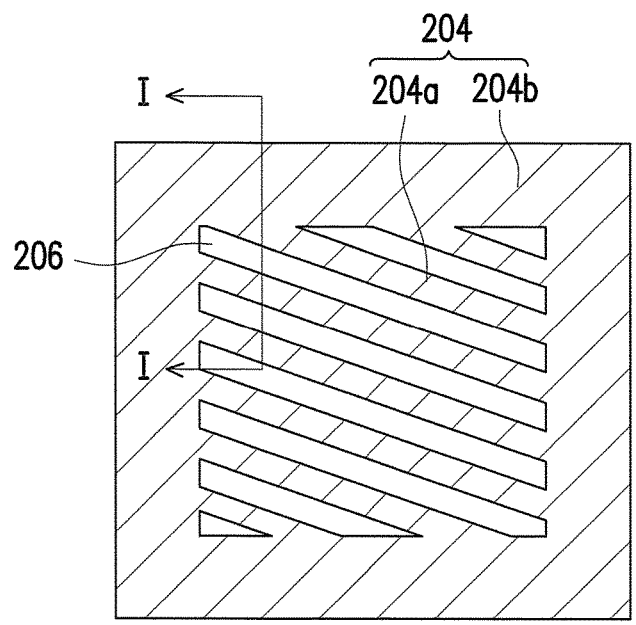
FIGS. 4A through 4C are schematic cross-sectional views illustrating a process of fabricating an active region structure according to an embodiment of the invention.
Figure 4B:
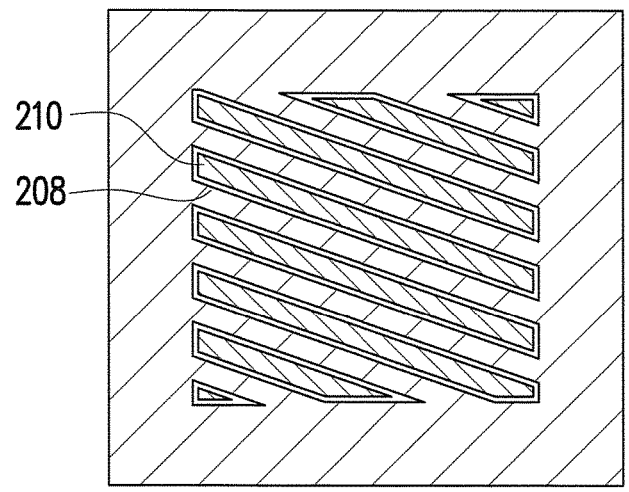
Figure 4C:
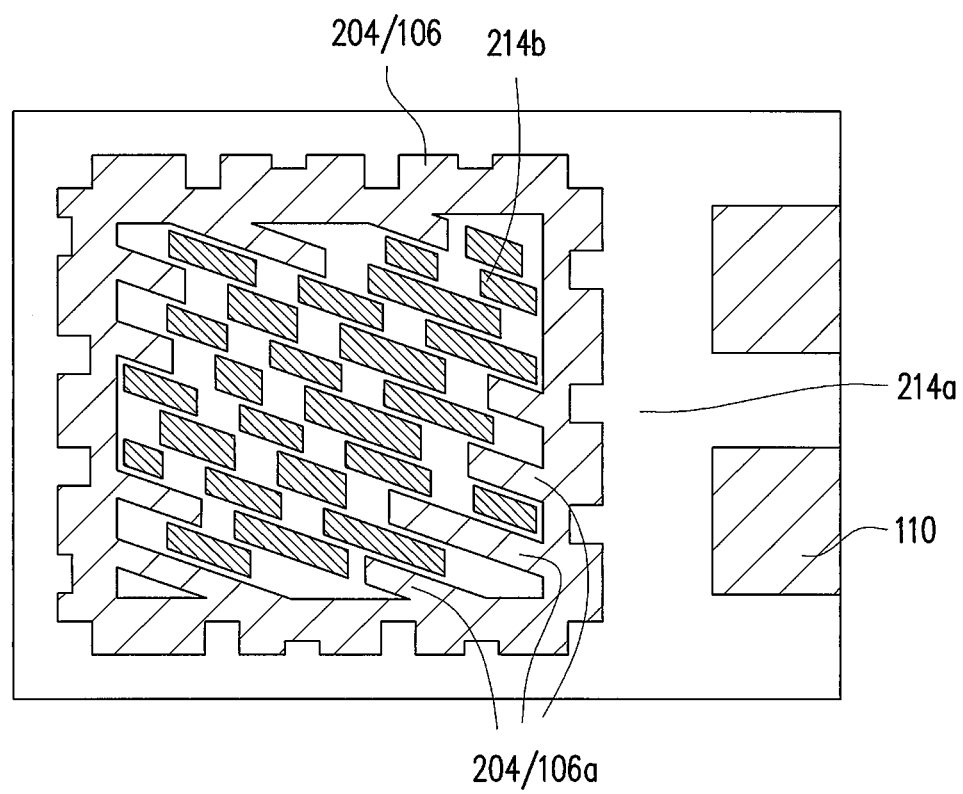

Referring to FIGS. 3A and 4A, a substrate 200 is employed as a base, and a plurality of detailed processes for patterning the substrate are performed. For example, the patterning of the substrate 200 is described according to cross-sectional structure change along a dividing line I-I of FIG. 4A. The substrate 200 is, for example, a silicon substrate. A first mask layer 202 is formed on the substrate 200. The first mask layer 202 is made of a dielectric material, and a combination of multilayer dielectric materials may be further applied thereto, for example. However, the invention is not intent to limit the composition of the internal structure of the first mask layer 202. Thereafter, a second mask layer 204 is formed on the first mask layer 202. The second mask layer 204 is made of a material similar to that of the substrate, such as amorphous silicon, polysilicon, or other forms of silicon material.

A patterning process is performed on the second mask layer 204, which includes a lithography and an etching steps, such that strip openings 206 are formed to the second mask layer 204 to expose the first mask layer 202. The remaining parts of the second mask layer 204 include mandrels 204a and a border region 204b predicted for forming the border structure 106. It can be understood herein that the structure sizes are merely schematically illustrated, but not absolute ratios.

Figure 3B:
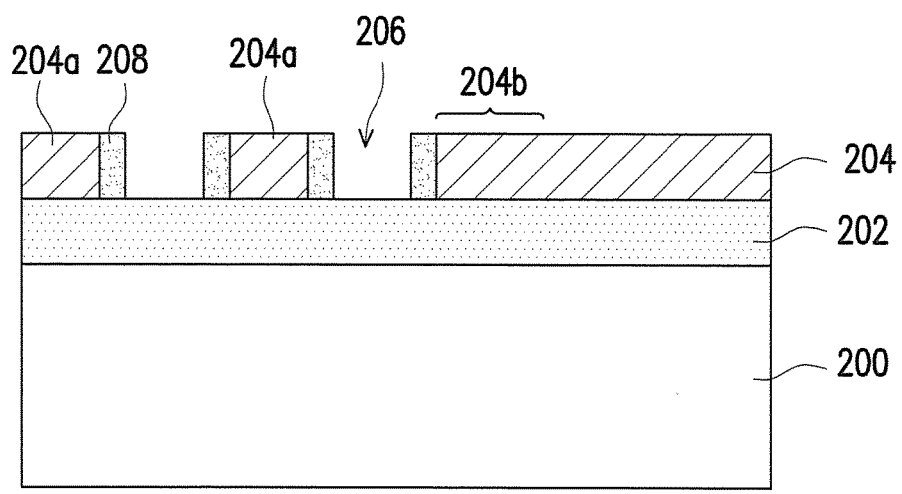

Referring to FIGS. 3B and 4B, a spacer 208 made of a dielectric material is formed on side walls of each opening 206. The spacer 208 is formed, for example, by first depositing a dielectric layer to cover the opening 206 and the second mask layer 204, and then etching the dielectric layer by means of etching back, so as to expose the second mask layer 204. The remaining parts of the dielectric layer form the spacers 208.

Figure 3C:
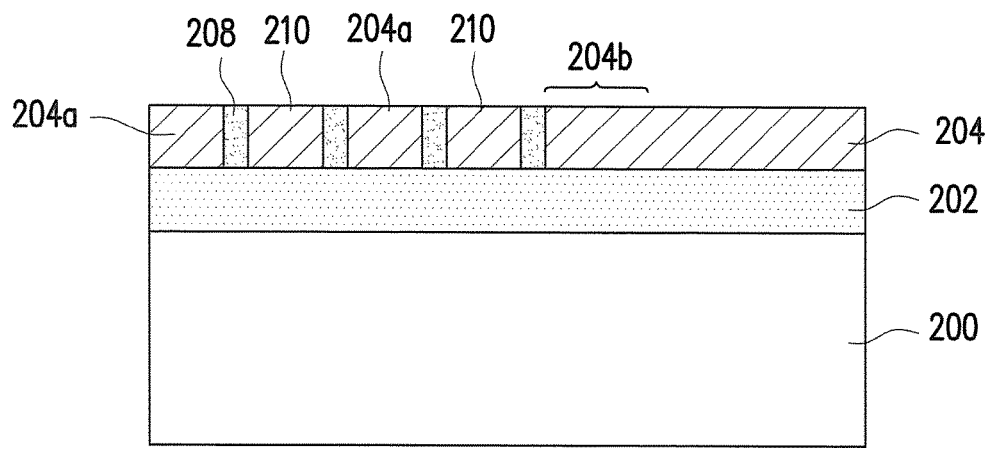

Referring to FIGS. 3C and 4B, a material same as that of the second mask layer 204 is filled in the openings 206, which includes, for example, a strip filling layer 210 used in the depositing and the etching steps. It is to be noted that FIG. 3C is extended relatively to the dividing line I-I in FIG. 4A for the illustration of more cross-sectional structures. Thus, the mandrels 204a and the filling layer 210 are schematically illustrated in greater numbers herein, rather than structurally changed. In terms of the function of the actual structure, the filling layer 210 is combined with the second mask layer 204, i.e., becomes a portion of the second mask layer 204. As the spacer may be thin, a gap between the mandrel 204a and the filling layer 210 may be small, which facilitates the fabrication of small-sized devices. A line width of the mandrel 204a and a line width of the filling layer 210 are substantially the same, which is not the only choice of the invention.

Figure 3D:
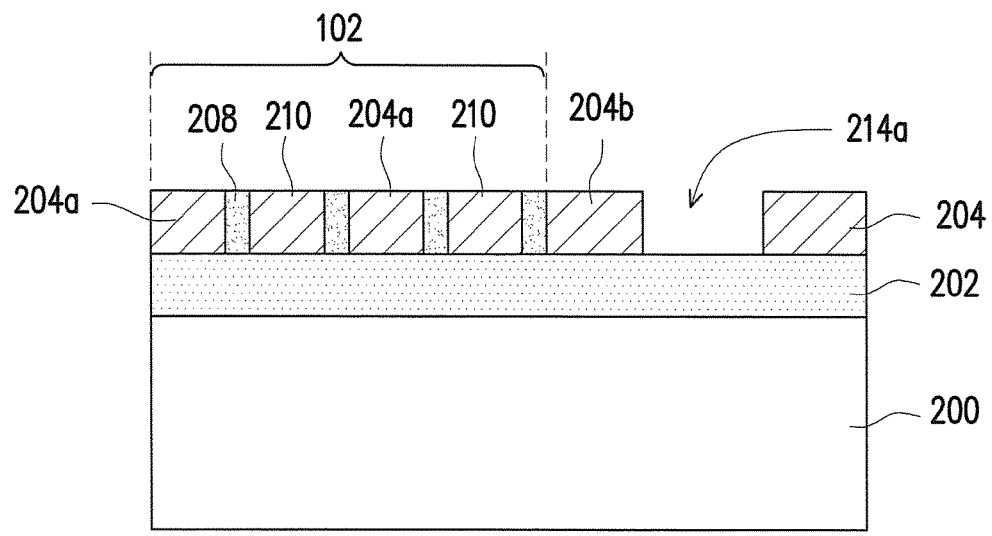

Referring to FIGS. 3D and 4C, the second mask layer 204 continues to be patterned, such that the regions predicted for subsequently forming the device cells 104, the border structure 106 and the peripheral active region 110 are preserved, while the other removed regions 214a are predicted for subsequently forming the STI layer 108. The number and a position of the peripheral active region 110 are configured according to actual demands, and the peripheral active region 110 generally surrounds the border structure 106. The cross-sectional structure of FIG. 3D also illustrates a region 214a in the middle which is removed. Openings 214b distributed along the active lines in the device region 102 provide function in subsequently for separating the mandrels 204a from the filling layers 210, so as to form the plurality of device cells 104. The device cells 104 are strip members in small segments, and a longitudinal direction thereof is an extension direction of the active lines. The cross-section of FIG. 3D does not illustrate the openings 214b.

According to FIG. 4C, by separating the mandrels 204 from the filling layers 210, a part of the second mask layer 204 corresponding to the border structure 106 includes a branch 106a which keeps being aligned to the corresponding active line and extends into the device region 102.

Figure 3E:
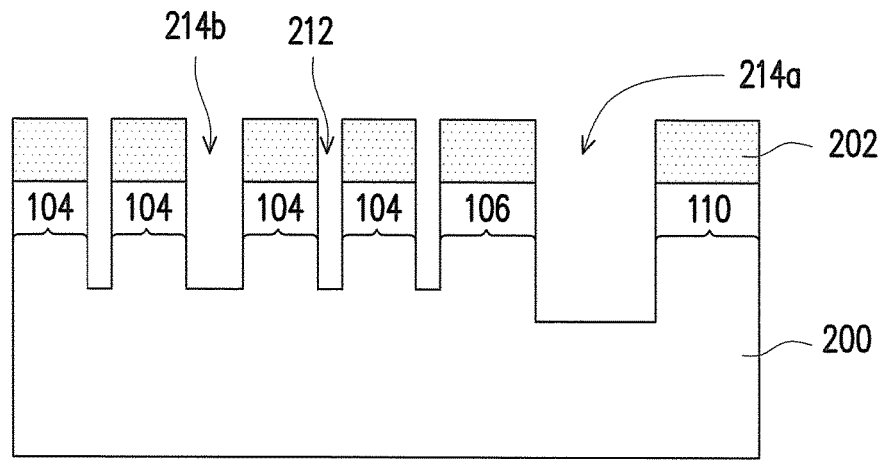

Referring to FIG. 3E, after the fabrication process illustrated in FIGS. 3A to 3D, the spacers 208 are removed by an etching process, and the first mask layer 202 and the substrate 200 are etched by using the second mask layer 204 as an etching mask. The combined overall structure schematically illustrated in FIG. 3E also includes the openings 214b used for separating the active lines to form the plurality of device cells 104 and the gaps between each of the active lines. Namely, the cross-section simultaneously includes cross-sectional structures of different regions. In the etching step, a plurality of etching steps may be included by adjustment of an etchant, for example, for the material. However, when the substrate 200 is etched, the second mask layer 204 is etched altogether because the second mask layer 204 and the substrate 200 have the similar material, and only the first mask layer 202 is preserved, so as to form a shallow trench in the substrate 200. In this stage, the region 214a illustrated in FIG. 4C is an etched shallow trench formed at the outer periphery of the border structure 106 or the region between the border structure 106 and the peripheral active region 110. The shallow trench herein has a greater opening width and is etched easily, which indicates better etching efficiency and thus, is deeper than trenches of other regions. There are also gaps 212 between the device cells 104. Additionally, the corresponding opening 214b also has a well-shaped trench.

Figure 3F:
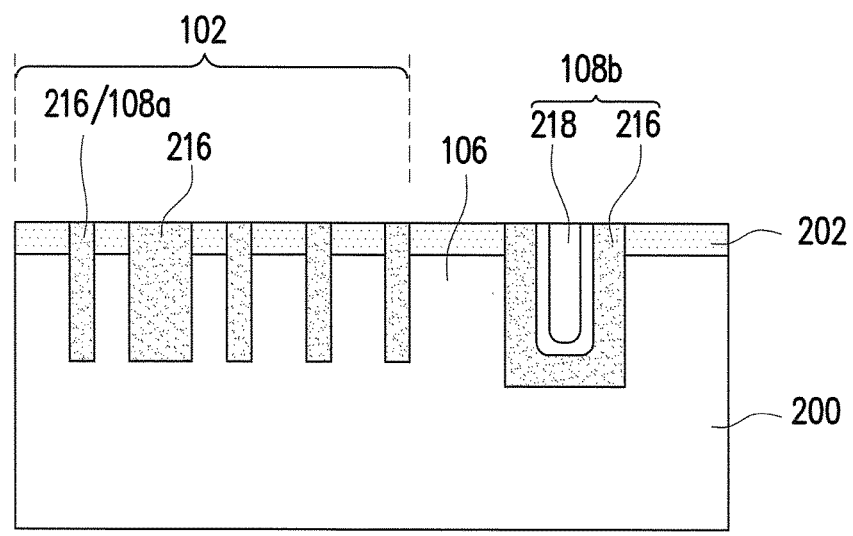

In the status illustrated in FIG. 3E, the surface of the substrate 200 is patterned, and a structure of the active layer 150 is obtained. Thereafter, the STI layer is to be formed to insulate the device cells. Referring to FIG. 3F, a dielectric layer 216 (e.g., silicon oxide) is further entirely deposited on the structure illustrated in FIG. 3E and filled in the trenches on the substrate, which is mainly filled in the gaps between the device cells. Because the region 214 may also include the region containing the opening 214b, or may not be filled with the dielectric layer 216, a spin-on dielectric (SOD) process, for example, may further be performed to fill an SOD layer 218 in the trenches. Then, an anneal-curing and a chemical mechanical polishing processes, for example, are performed to planarize the surface, wherein a portion of the first mask layer 202 is also preserved to protect the surface of the substrate 200. The STI layer 108 may include a first part 108a and a second part 108b which are divided by the border structure 106.

Figure 5:
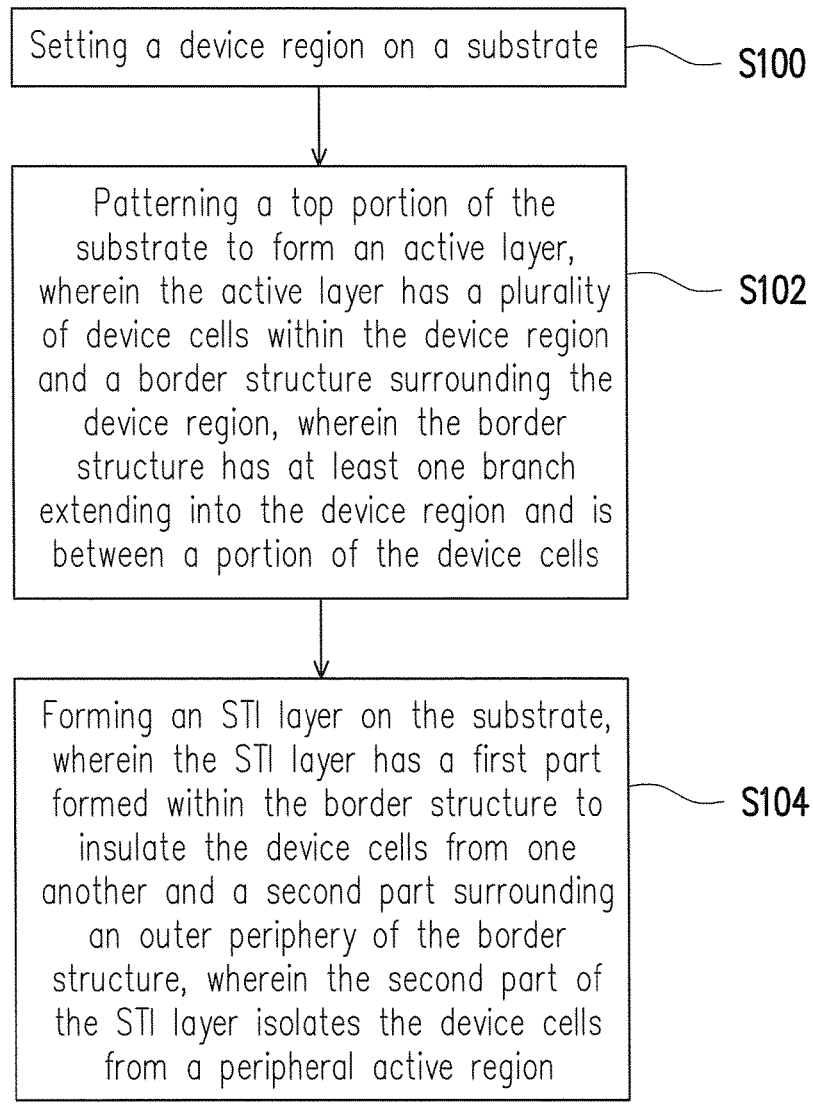
FIG. 5 is a flowchart of a fabricating method of an active region structure according to an embodiment of the invention.

The invention is not limited to the fabrication method illustrated in the embodiment above, as long as the substrate is patterned, the described structure can be formed. FIG. 5 is a flowchart of a fabricating method of an active region structure according to an embodiment of the invention.

Referring to FIG. 5, the fabrication method of the active region structure includes step S100, where a dielectric layer is set on a substrate. Then, in step S102, a top portion of the substrate is patterned to form an active layer. The active layer has a plurality of device cells within the device region and a border structure surrounding the device region. The border structure has at least one branch extending into the device region and is between a portion of the device cells. In step S104, an STI layer is formed on the substrate. The STI layer has a first part formed in the border structure to insulate the device cells from one another and a second part surrounding an outer periphery of the border structure. The second part of the STI layer isolates the device cells from a peripheral active region.

Based on the above, in the active region structure and the fabrication method thereof provided by the invention, the periphery of the device region also includes the border structure surrounding the device region, such that the stress generated by the STI layer with a greater area in the device region in the outer periphery can be blocked. Thereby, the device cells in the periphery region of the device region can be prevented from being damaged due to the stress. In addition, the border structure includes the at least one branch extending into the device region, which can compensate the unbalanced stress occurring between the end parts of the active lines and also can prevent the device cells from being damaged.

Moreover, the notches can also be disposed in the outer periphery of the border structure, so as to further enhance the strength of the border structure to resist the stress generated by the STI layer in the outer periphery.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. An active region substrate, comprising:
   a device region, defined on a substrate;
   an active layer, formed by a top portion of the substrate and having a plurality of device cells within the device region and a border structure surrounding the device region, wherein the border structure has at least one branch extending into the device region and is between a portion of the device cells; and
   a shallow trench isolation (STI) layer, having a first part formed in the border structure to insulate the device cells from one another and a second part surrounding an outer periphery of the border structure,
   wherein the second part of the STI layer isolates the device cells from a peripheral active region.

2. The active region structure according to claim 1, wherein each of the device cells is a strip device having a longitudinal direction, the device cells are aligned in the longitudinal direction to form a plurality of active lines, and each of the active lines has multiple of the device cells.

3. The active region structure according to claim 2, wherein each of the at least one branch is aligned to a corresponding active line among the active lines, and between two adjacent active lines.

4. The active region structure according to claim 2, wherein the multiple device cells and the branch belonging to the same active line have a same line width.

5. The active region structure according to claim 1, wherein the outer periphery of the border structure has a plurality of notches.

6. The active region structure according to claim 1, wherein the border structure comprises separated multi-segment borders respectively disposed at multiple edges of the device region, and the STI layer isolates the multi-segment borders from one another.

7. The active region structure according to claim 6, wherein an outer periphery of the multi-segment borders has at least one notch.

8. The active region structure according to claim 1, the border structure continuously surrounds the device region.

9. A method of forming an active region structure, comprising:
   setting a device region on a substrate;
   patterning a top portion of the substrate to form an active layer,
   wherein the active layer has a plurality of device cells within the device region and a border structure surrounding the device region,
   wherein the border structure has at least one branch extending into the device region and is between a portion of the device cells; and
   forming a shallow trench isolation (STI) layer on the substrate,
   wherein the STI layer has a first part formed within the border structure to insulate the device cells from one another and a second part surrounding an outer periphery of the border structure,
   wherein the second part of the STI layer isolates the device cells from a peripheral active region.

10. The method according to claim 9, wherein each of the device cells is a strip device in a longitudinal direction, the device cells are aligned in the longitudinal direction to form a plurality of active lines, and each of the active lines has multiple of the device cells.

11. The method according to claim 10, wherein each of the at least one branch is aligned to a corresponding active line among the active lines, and between two adjacent active lines.

12. The method according to claim 10, wherein the multiple device cells and the branch belonging to the same active line have a same line width.

13. The method according to claim 9, wherein the outer periphery of the border structure has a plurality of notches.

14. The method according to claim 9, wherein the border structure comprises a plurality of separated multi-segment borders respectively disposed at multiple edges of the device region, and the STI layer isolates the multi-segment borders from one another.

15. The method according to claim 14, wherein an outer periphery of the multi-segment borders has at least one notch.

16. The method according to claim 9, the border structure continuously surrounds the device region.

\* \* \* \* \*